(12) United States Patent
Lai et al.

(10) Patent No.: US 6,399,487 B1
(45) Date of Patent: Jun. 4, 2002

(54) METHOD OF REDUCING PHASE TRANSITION TEMPERATURE BY USING SILICON-GERMANIUM ALLOYS

(75) Inventors: Jane-Bai Lai, Hsin-Chu; Lih-Juan Chen; Chung-Shi Liu, both of Hsinchu; Chen-Hua Yu, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/222,269

(22) Filed: Dec. 28, 1998

(51) Int. Cl.$^7$ ............................................... H01L 21/44
(52) U.S. Cl. ....................................................... 438/664
(58) Field of Search ................................. 438/664, 649, 438/656, 660, 682

(56) References Cited

U.S. PATENT DOCUMENTS

| | | | |
|---|---|---|---|
| 4,756,927 A | 7/1988 | Black et al. | 427/53.1 |
| 5,250,818 A | 10/1993 | Saraswat et al. | 257/66 |
| 5,591,653 A | 1/1997 | Sameshima et al. | 437/40 |
| 5,646,073 A | 7/1997 | Grider et al. | 437/233 |
| 5,726,459 A | 3/1998 | Hsu et al. | 257/55 |
| 5,915,199 A * | 6/1999 | Hsu | 438/618 |

OTHER PUBLICATIONS

Zhang et al., On the Intrinsic Spacer Layer in Si/SiGe Heterojunction Bipolar Transistor Grown by Ultra High Vacuum Chemical Vapor Deposition. 1997 IEEE/Cornell Conf. on Advanced Concepts in High Speed Semiconductor Devices and Circuits, 8/97. P.109–115.*

* cited by examiner

Primary Examiner—Olik Chaudhuri
Assistant Examiner—Ginette Peralta
(74) Attorney, Agent, or Firm—George O. Saile; Stephen B. Ackerman

(57) ABSTRACT

An improved SALICIDE process is described wherein the transformation temperature to a lower resistivity suicide structure is reduced by first coating with a layer of a silicon-germanium alloy prior to the deposition of the titanium layer. Provided there is at least 40 atomic percent of germanium in the alloy a second RTA at a temperature no higher than about 650° C. may be effectively used. The resulting ternary alloy has a resistivity of about 15–20 microhm cm which corresponds to a sheet resistance of about 3–3.5 ohms per square. The ability to achieve low sheet resistance after annealing at such a low temperature becomes increasingly more important as device dimensions decrease since the second RTA becomes increasingly more likely to result in agglomeration of the silicidelayer.

14 Claims, 3 Drawing Sheets

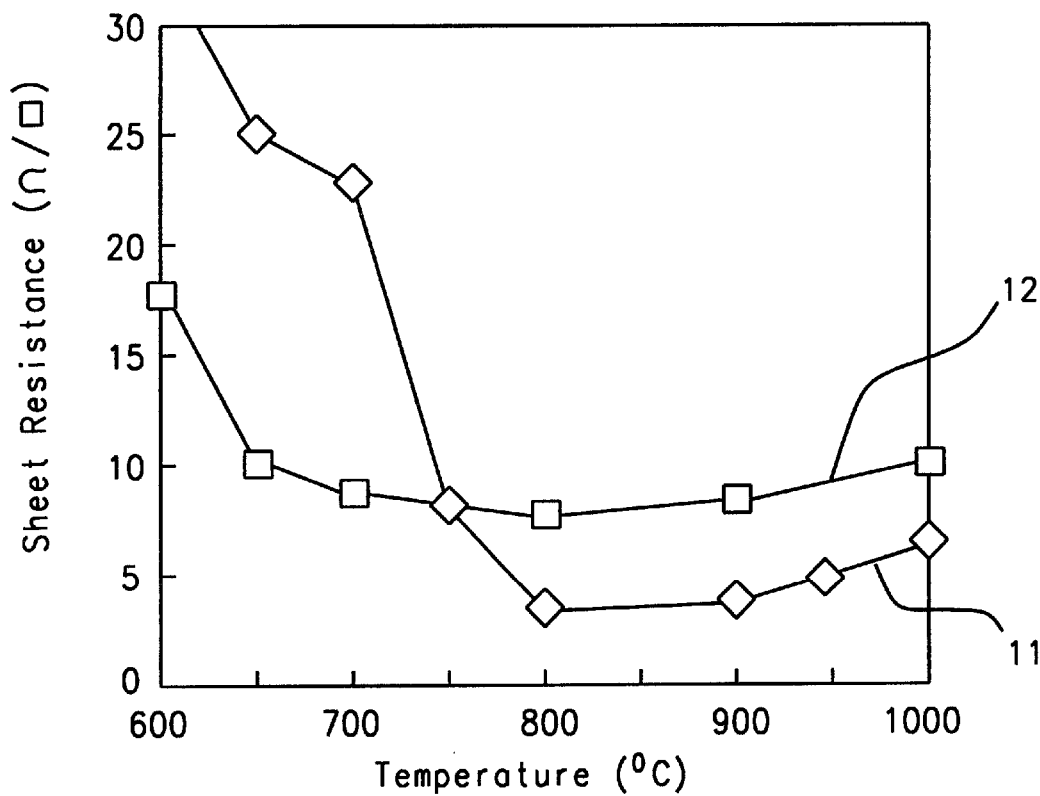
FIG. 1 - Prior Art
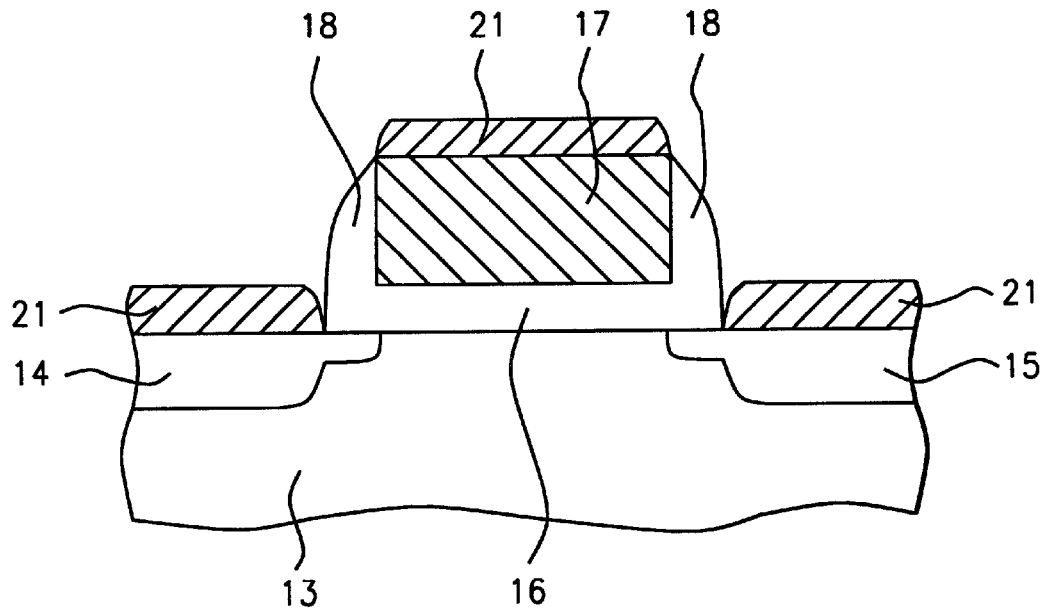
FIG. 2

METHOD OF REDUCING PHASE TRANSITION TEMPERATURE BY USING SILICON-GERMANIUM ALLOYS

FIELD OF THE INVENTION

The invention relates to the general field of integrated circuit manufacture with particular reference to reducing the temperature of annealing during a SALICIDE process.

BACKGROUND OF THE INVENTION

In the course of manufacturing an integrated circuit, the problem often arises of having to make contact to very small areas that are located very close together. In particular, two silicon regions may be separated by a very narrow band of silicon oxide. A common example of this is the source and drain of a field effect transistor which are separated from the gate pedestal contact by very small insulating spacers. To deal with this the SALICIDE (self aligned silicide) process was developed. This takes advantage of the fact that a metal such as titanium (also cobalt and tungsten have been used) when heated for a short time (of the order of seconds) to a temperature of about 800° C. very rapidly reacts with any silicon with which it is in contact to form titanium silicide. On the other hand, no reaction will occur between titanium and the silicon oxide so that a selective etchant that removes titanium while not attacking titanium silicide, can be used after the RTA to selectively remove all unreacted titanium, leaving material in-place only where titanium had been in contact with silicon.

Although the SALICIDE process, as described above, works very well, there is a secondary problem. It turns out that the structure of the titanium silicide resulting from the RTA described above is a crystalline type known as C-49. This particular structure has a relatively high bulk resistivity (50–60 microhm cm). Fortunately, the crystalline structure of the titanium silicide can be transformed to a different arrangement (known as C-54 and having a bulk resistivity of about 13–20 microhm cm.) by applying an additional heat treatment. In the past, the temperature needed to achieve this crystalline transformation has been about 750–800° C. However, it has been found that as device dimensions continue to shrink the required transformation temperature has risen because an associated decrease in grain size reduces the probability for nucleation and growth of the C-54 phase. Unfortunately, these higher transformation temperatures cause the titanium silicide to agglomerate, so that its sheet resistance rises precipitously.

Thus, there exists a need for a SALICIDE process wherein the transformation temperature to the lower resistivity crystal structure does not exceed about 900° C. An approach commonly taken in the prior art has been to introduce a layer of molybdenum between the titanium and the silicon prior to heating. The effects of this are illustrated in FIG. 1 which is a plot of sheet resistance as a function of the RTA temperature. Curve 11 is for pure titanium while curve 12 is for the titanium-molybdenum combination. As can be seen, for pure titanium the transformation occurs at about 750° C. while it has been reduced to about 650° C. for the Ti—Mo combination. On the other hand, the sheet resistance of the final layer has increased from about 4.5 ohms per square for the pure titanium to about 8 ohms per square for the Ti—Mo.

The present invention describes a different approach to solving this problem. As will be shown, the temperature for achieving the transition to the lower resistivity phase may be reduced to as low as 650° C. while at the same time achieving a sheet resistance that is less than 3.5 ohms per square. In the course of searching the prior art no reference that teaches the method of the present invention was discovered. However, several references of interest were found:

Black et al. (U.S. Pat. No. 4,756,927 July 1988) describe how suicides of metals such as titanium, molybdenum and tungsten can be formed in selected areas by exposing a surface to a gas including the fluoride compounds of these metals as well as silane and then irradiating selected areas by means of a laser. They note the possibility of forming germanium suicides by substituting germane for silane. Presumably, alloys comprising one of these metals, along with silicon and germanium, could be formed by including both silane and germane in the reacting gases.

Other applications of silicon-germanium alloys appear to be limited to their use as the prime material for forming an integrated circuit. For example Sameshima et al. (U.S. Pat. No. 5,591,653 January 1997) describe a method of manufacturing a silicon-germanium thin film transistor. Similarly, Saraswat et al. (U.S. Pat. No. 5,250,818 October 1993) describe a germanium-silicon-on-insulator thin film transistor while Hsu et al. (U.S. Pat. No. 5,726,459 March 1998) also describe fabrication of a silicon-germanium MOS transistor.

Grider et al. (U.S. Pat. No. 5,646,073 July 1997) show a method of forming a silicon-germanium alloy.

SUMMARY OF THE INVENTION

It has been an object of the present invention to provide a method whereby selective contact may be made to silicon regions in close proximity to insulating regions.

Another object of the invention has been to provide an improved SALICIDE process wherein a second rapid thermal anneal (for the purpose of reducing the resistivity of the silicide layer) can be accomplished at a lower temperature than is currently achieved in the art.

A still further object of the invention has been that said method result in a sheet resistance for the silicide layer that is at least as low as that obtained when using the conventional SALICIDE process.

These objects have been achieved by coating the structure to which the SALICIDE process is to be applied with a layer of a silicon-germanium alloy prior to the deposition of the titanium layer. Provided there is at least 40 atomic percent of germanium in the alloy a second RTA at a temperature no higher than about 650° C. may be effectively used. The resulting ternary alloy has a resistivity of about 15–20 microhm cm which corresponds to a sheet reistance of about 3–3.5 ohms per square. The ability to achieve low sheet resistance after annealing at such a low temperature becomes increasingly more important as device dimensions decrease since the second RTA becomes increasingly more likely to result in agglomeration of the silicide layer.

BRIEF DESCRIPTION OF THE DRAWINGS

FIG. 1 is a plot of sheet resistance as a function of annealing temperature for pure titanium and a titanium-molybdenum alloy.

FIG. 2 shows a cross-section of a conventional low density drain structure to which a layer of a silicon-germanium alloy has been added.

DESCRIPTION OF THE PREFERRED EMBODIMENTS

Figure 3:
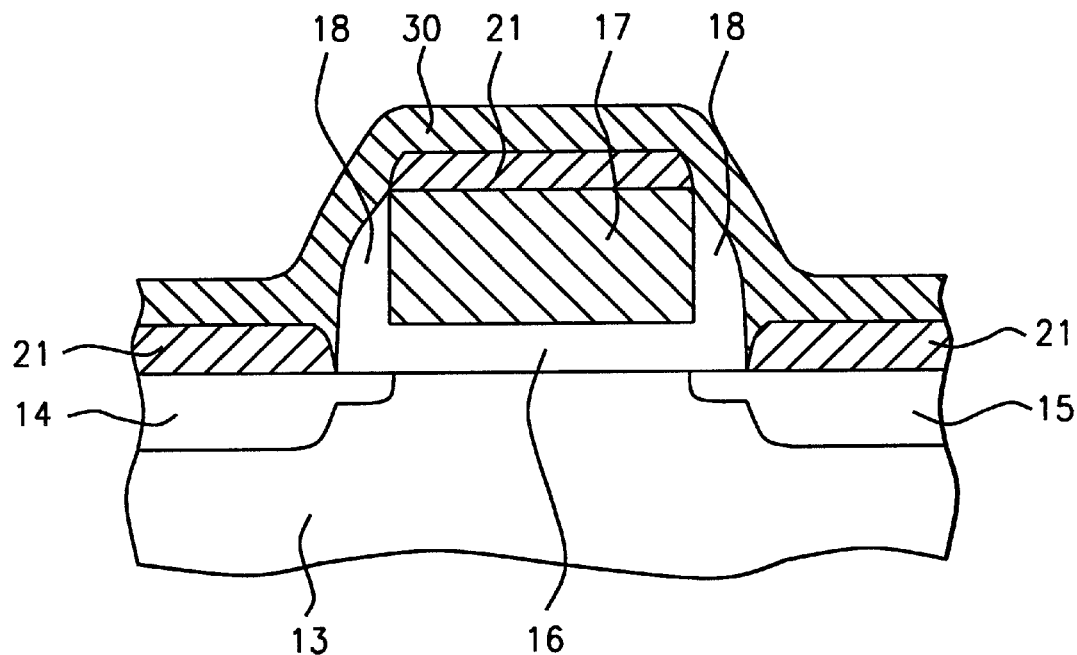
FIG. 3 illustrates the structure of FIG. 2 after a layer of titanium has been deposited over it.
Figure 4:
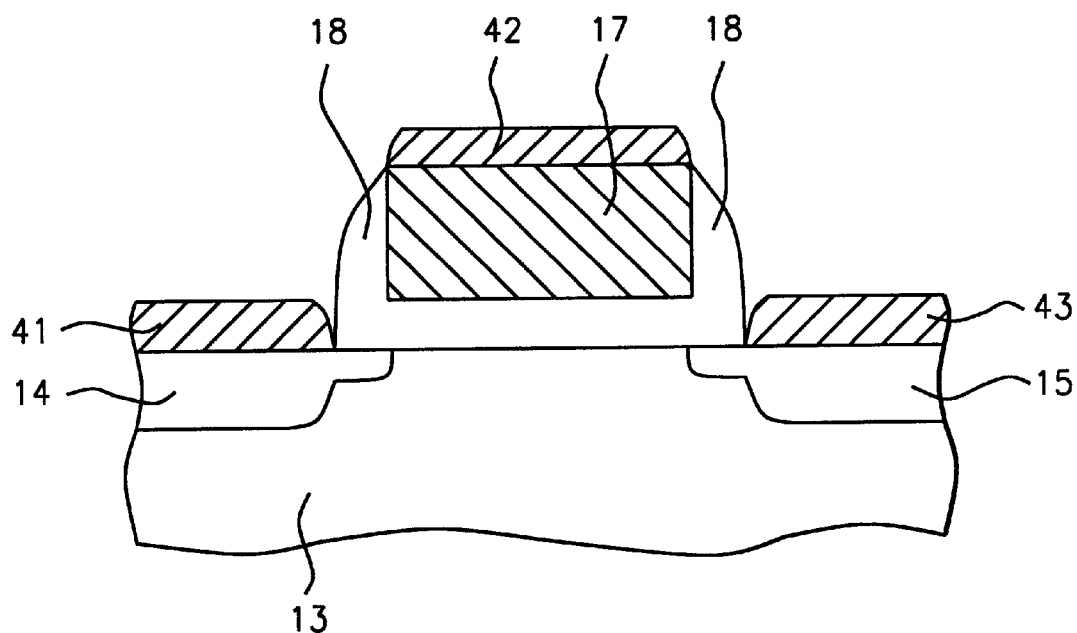
FIG. 4 shows the structure of FIG. 3 after heating and the selective removal of all unreacted titanium.

Although the present invention is described in the context of an improved SALICIDE process used during the manufacture of an integrated circuit, it will be understood by those skilled in the art that the invention is more general and is applicable to any situation where selective contact needs to be made to areas of silicon located very close to areas of silicon oxide.

The manufacture of a field effect transistor within an integrated circuit is a well-known process which we will not repeat here in detail. In particular, the structure known as the lightly doped drain (LDD) begins with the provision of a body of silicon whose top surface gets oxidized to form a layer of gate oxide. A layer of polysilicon is then deposited onto this layer of gate oxide and is patterned and etched to a form a gate pedestal. The source and drain regions are then formed in two steps, the gate pedestal acting as its own mask in each case. First, a shallow, lightly doped region is formed on opposing sides of the gate. Then, insulating spacers are grown on the vertical walls of the gate pedestal and a second, deeper and more heavily doped, region is formed. This gives the device the appearance shown in the cross section of FIG. 2 where pedestal 17 sits on top of oxide layer 16 and is surrounded on both sides by spacers 18. Lightly doped source and drain 14 and 15 are seen within silicon body 13.

In a departure from the normal process a key feature of the invention is introduced here. Layer 21, comprising a silicon germanium alloy, is selectively deposited on all silicon surfaces. As will be discussed in greater detail below, the atomic percent of germanium in the alloy should be between about 40 and 70%. The thickness of the alloy layer is between about 700 and 800 Angstroms. Our preferred method for selectively depositing the silicon-germanium alloy layer has been Chemical Vapor Deposition (CVD) using an Ultra High Vacuum (UHV) apparatus (to eliminate background contamination). Silane ($SiH_4$) and germane ($GeH_4$) gases at a pressure of about 3 mtorr and a deposition temperature between about 400 and 600° C.

Following the deposition of the silicon-germanium the normal sequence for the SALICIDE process is continued. Referring now to FIG. 3, titanium layer 30 is deposited over all surfaces. The system is given a first heat treatment in the form of a rapid thermal anneal at a temperature between about 600 and 650° C. for between about 20 and 40 seconds. This results in the formation of a titanium alloy wherever titanium is in contact with silicon-germanium. No reaction occurs where the titanium is in contact with silicon oxide, for example where it overlies the spacers 18. This is followed by etching in an aqueous solution of ammonia and hydrogen peroxide for between about 15 and 25 minutes at between about 20 and 40° C. which results in removal of all unreacted titanium, leaving behind conductive material over the source, drain, and gate but not over the spacers.

As discussed above, the titanium alloy that results from the first RTA has a relatively high resistivity. Normal practice when using the SALICIDE process would be to now heat to at least 850° C. in order to change the crystal structure of the titanium alloy to one having a lower resistivity. However, because the titanium alloy is not a pure silicide but is in fact a ternary alloy of titanium, silicon, and germanium, the temperature at which the phase transition occurs has been dropped significantly to between about 650 and 700° C. The time period required for this second RTA is between about 20 and 40 seconds.

As a result of using the silicon-germanium alloy in place of pure silicon, the sheet resistance of the contacting layer dropped from between about 9 and 10 ohms per square before the second RTA, to between about 3 and 3.5 ohms per square after the second RTA.

Figure 5:
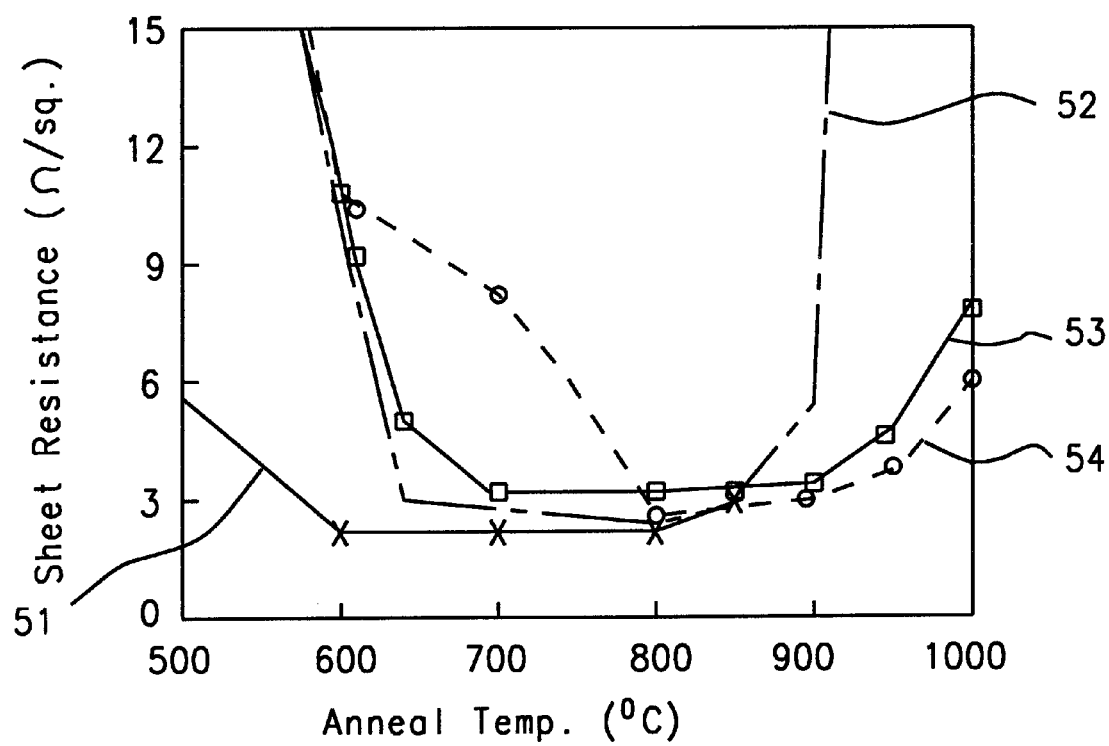
FIG. 5 plots sheet resistance as a function of annealing temperature for several different silicon-germanium alloy compositions.

The reasons for choosing an alloy composition containing between about 40 and 70 atomic percent germanium as well as requiring the RTA temperature to be between about 650 and 700° C., can readily be seen from FIG. 5. Four different curves, each representing a different alloy composition, have been plotted showing the sheet resistance as a function of anneal temperature. Curve 51 is for the case of pure germanium. As can be seen, it results in the lowest sheet resistance at the lowest temperature. However, the melting point of pure germanium is too low for it to be useful within the overall process.

Curve 52 is for an alloy containing 70 atomic percent of germanium. Again, a lower RTA temperature than that of the conventional SALICIDE process is obtained along with a low sheet resistance. The main problem with this composition is that it is prone to agglomeration at about 900° C. causing its sheet resistance to rise to infinity.

Curve 53 is for an alloy containing 40 atomic percent of germanium. For this composition, the desired result is seen to have occurred since an RTA temperature of about 700° C. is now sufficient and the sheet resistance has dropped to the useful value of about the 3 ohms per square. Furthermore, subsequent heating of this composition is seen to have little influence on the sheet resistance to temperatures as high as 1,000° C.

Curve 54 is for an alloy containing 30 atomic percent of germanium. It can be seen that this amount is insufficient to drop required RTA temperature below about 800° C. although the sheet resistance that results is comparable to that of the alloy depicted in curve 53 (40 percent germanium). As expected, the alloy of curve 54 is even more stable at high temperatures than the alloy of curve 53. Thus, FIG. 5 shows that for the invention to function satisfactorily an alloy composition containing between about 40 and 70 atomic percent germanium must be used. If this is done the RTA temperature to convert from the C-49 to the C-54 structure need not exceed 900° C.

While the invention has been particularly shown and described with reference to the preferred embodiments thereof, it will be understood by those skilled in the art that various changes in form and details may be made without departing from the spirit and scope of the invention.

What is claimed is:

1. A selective contacting process comprising:

providing a silicon body having a top surface which includes at least one area of silicon oxide;

depositing a layer of silicon-germanium alloy, containing between 50 and 69.9 atomic percent of germanium, on the silicon top surface;

depositing a layer of titanium on said silicon-germanium layer;

subjecting the silicon body to a first rapid thermal anneal, thereby causing the titanium that is in contact with said silicon-germanium layer to form a layer of titanium-silicon-germanium alloy having a first sheet resistance value;

selectively removing all unreacted titanium; and subjecting said silicon body to a second rapid thermal anneal for between about 20 and 40 seconds at a temperature between 650 and 699.9° C., whereby a change in crystalline form occurs and said titanium-silicon-germanium alloy has its resistivity reduced to between about 15 and 20 micro-ohm-cm.

2. The process of claim 1 wherein said layer of silicon-germanium alloy has a thickness that is between about 700 and 750 Angstroms.

3. The process of claim 1 wherein the step of depositing a layer of silicon-germanium alloy further comprises Chemical Vapor Deposition in an Ultra High Vacuum apparatus using silane and germane gases at a pressure of about 3 mtorr and a deposition temperature between about 400 and 600° C.

4. The process of claim 1 wherein said layer of titanium is deposited to a thickness between about 250 and 300 Angstroms.

5. The process of claim 1 wherein said first thermal anneal further comprises heating to a temperature between about 550 and 600° C. for between about 20 and 40 seconds.

6. The process of claim 1 wherein the step of removing all unreacted titanium further comprises etching in an aqueous solution of ammonia and hydrogen peroxide for between about 15 and 25 minutes at between about 20 and 40° C.

7. The process of claim 1 wherein said first sheet resistance value is between about 9 and 10 ohms per square.

8. A method of making selective contact to silicon areas within an integrated circuit, comprising:

providing a body of silicon forming a layer of gate oxide on a surface of said silicon body;

depositing a layer of polysilicon on said gate oxide, patterning and etching said polysilicon to form a gate pedestal, and removing gate oxide not covered by the pedestal;

forming low density source and drain structures on opposing sides of said gate pedestal, including growing insulating spacers on all vertical surfaces of the pedestal;

selectively depositing a layer of silicon-germanium alloy, containing between 50 and 69.9 atomic percent of germanium, on the source, drain, and gate;

depositing a layer of titanium on the silicon-germanium layer;

subjecting the silicon body to a first rapid thermal anneal, thereby causing the titanium that is in contact with said silicon-germanium layer to form a layer of titanium-silicon-germanium alloy having a first sheet resistance value;

selectively removing all unreacted titanium; and subjecting said silicon body to a second rapid thermal anneal for between about 20 and 40 seconds at a temperature between 650 and 699.9° C., whereby a change in crystalline form occurs and said titanium-silicon-germanium alloy has its resistivity reduced to between about 15 and 20 micro-ohm cm.

9. The process of claim 8 wherein said layer of silicon-germanium alloy has a thickness that is between about 700 and 750 Angstroms.

10. The process of claim 8 wherein the step of depositing a layer of silicon-germanium alloy further comprises Chemical Vapor Deposition in an Ultra High Vacuum apparatus using silane and germane gases at a pressure of about 3 mtorr and a deposition temperature between about 400 and 600° C.

11. The process of claim 8 wherein said layer of titanium is deposited to a thickness between about 250 and 300 Angstroms.

12. The process of claim 8 wherein said first thermal anneal further comprises heating to a temperature between about 550 and 600° C. for between about 20 and 40 seconds.

13. The process of claim 8 wherein the step of removing all unreacted titanium further comprises etching in an aqueous solution of ammonia and hydrogen peroxide for between about 15 and 25 minutes at between about 20 and 40° C.

14. Process of claim 8 wherein said first sheet resistance value is between about 9 and 10 ohms per square.

* * * * *

UNITED STATES PATENT AND TRADEMARK OFFICE
CERTIFICATE OF CORRECTION

PATENT NO.    : 6,399,487 B1
DATED         : June 4, 2002
INVENTOR(S)   : Jane-Bai Lai, Lih-Juann Chen, Chung-Shi Liu and Chen-Hua Yu It is certified that error appears in the above-identified patent and that said Letters Patent is hereby corrected as shown below:

<u>Title page,</u>
Item [75], Inventors, please delete "Lih-Juan Chen", and replace it with
-- Lih-Juann Chen --.

Signed and Sealed this

Twenty-seventh Day of August, 2002

*Attest:*

JAMES E. ROGAN
*Attesting Officer*        *Director of the United States Patent and Trademark Office*